(12) United States Patent
Horger et al.

(10) Patent No.: US 10,054,656 B2
(45) Date of Patent: Aug. 21, 2018

(54) METHOD AND APPARATUS THAT ACQUIRE MAGNETIC RESONANCE DATA USING A 3D TURBO OR FAST SPIN ECHO PULSE SEQUENCE WITH A LENGTHENED ECHO SPACING

(71) Applicants: Siemens Healthcare GmbH, Erlangen (DE); University of Virginia, Charlottesville, VA (US)

(72) Inventors: Wilhelm Horger, Schwaig (DE); Miriam Keil, Erlangen-Dechsendorf (DE); John Mugler, Charlottesville, VA (US); Dominik Paul, Bubenreuth (DE)

(73) Assignees: Siemens Healthcare GmbH, Erlangen (DE); University of Virginia Patent Foundation, Charlottesville, VA (US)

( * ) Notice: Subject to any disclaimer, the term of this patent is extended or adjusted under 35 U.S.C. 154(b) by 1005 days.

(21) Appl. No.: 14/444,216

(22) Filed: Jul. 28, 2014

(65) Prior Publication Data

US 2016/0025834 A1 Jan. 28, 2016

(51) Int. Cl.
*G01R 33/561* (2006.01)
*G01R 33/36* (2006.01)
(52) U.S. Cl.
CPC ...... *G01R 33/5617* (2013.01); *G01R 33/3614* (2013.01)

(58) Field of Classification Search
USPC .......................... 324/300–322; 600/407–435
See application file for complete search history.

(56) References Cited

U.S. PATENT DOCUMENTS

| | | | |
|---|---|---|---|
| 7,164,268 B2 | 1/2007 | Mugler, III et al. | |
| 7,705,597 B2 | 4/2010 | Horger et al. | |
| RE44,644 E * | 12/2013 | Mugler, III | 324/307 |
| RE45,725 E * | 10/2015 | Mugler, III | G01R 33/5615 |
| 9,360,545 B2 * | 6/2016 | Mugler, III | G01R 33/56509 |
| 9,535,149 B2 * | 1/2017 | Paul | G01R 33/583 |
| 2013/0342202 A1 * | 12/2013 | Mugler, III | G01R 33/5617 324/309 |
| 2014/0035579 A1 * | 2/2014 | Paul | G01R 33/5617 324/309 |
| 2015/0185305 A1 * | 7/2015 | Paul | G01R 33/32 324/309 |
| 2016/0025834 A1 * | 1/2016 | Horger | G01R 33/5617 324/309 |

* cited by examiner

*Primary Examiner* — Melissa Koval
*Assistant Examiner* — Tiffany Fetzner
(74) *Attorney, Agent, or Firm* — Schiff Hardin LLP

(57) ABSTRACT

A magnetic resonance data acquisition unit is operated according to an imaging protocol wherein at least one echo spacing exists following radiation of an excitation RF pulse, via an RF channel that includes an RF amplifier, and a subsequent readout of an echo. Loading of the RF amplifier is reduced by lengthening the echo spacing in the imaging protocol. One or more refocusing RF pulses are radiated with a lengthened echo spacing.

12 Claims, 6 Drawing Sheets

METHOD AND APPARATUS THAT ACQUIRE MAGNETIC RESONANCE DATA USING A 3D TURBO OR FAST SPIN ECHO PULSE SEQUENCE WITH A LENGTHENED ECHO SPACING

BACKGROUND OF THE INVENTION

Field of the Invention

The present invention concerns a method to acquire magnetic resonance data, as well as a magnetic resonance system, and an electronically readable data storage medium.

Description of the Prior Art

Magnetic resonance (MR) is a known modality with which images of the inside of an examination subject can be generated. Expressed in a simplified manner, for this purpose the examination subject, in the opening of a magnetic resonance apparatus, is positioned in a strong, static, homogeneous basic magnetic field (also called a $B_0$ field) with a field strength of 0.2 to 7 Tesla or more, such that nuclear spins in the subject orient preferentially along the basic magnetic field. Radio-frequency (RF) excitation pulses and possibly refocusing pulses are radiated into the examination subject to elicit magnetic resonance signals, which are detected and entered as data values into an electronic memory, in an organized manner that represents a domain known as k-space, such as a matrix. On the basis of the k-space data, MR images are reconstructed or spectroscopy data are determined. Rapidly switched (activated) magnetic gradient fields may be superimposed on the basic magnetic field for spatial encoding of the magnetic resonance data (measurement data). The acquired measurement data are digitized and stored as complex numerical values in a k-space matrix. For example, by means of a multidimensional Fourier transformation, an associated MR image can be reconstructed from the k-space matrix populated with values.

The aforementioned radio-frequency pulses and gradient fields are activated in the magnetic resonance apparatus according to various schemes, known as pulse sequences, with which the data acquisition unit is operated. Highly sophisticated spin-echo pulse sequences include single-slab three-dimensional (3D) turbo or fast spin-echo (hereafter 3D-TSE/FSE) pulse sequences known as, among other names, SPACE (Sampling Perfection with Application optimized Contrasts using different flip angle Evolutions). Pulse sequences of this type allow an extremely large number of refocusing RF pulses (e.g., more than 300), and may use a refocusing RF pulse train that exhibits pulses with mostly constant flip angles, or that exhibits pulses with respectively different flip angles of less than 180°, throughout the duration of the echo train. In the latter case, the values of the flip angles for the RF pulse train are selected so as to achieve desired signal strengths for different types of tissue, and are referred to as a flip angle evolution. Thus, this implementation of a 3D-TSE/FSE pulse sequence uses application-specific variable flip angles.

Many applications of the 3D-TSE/FSE pulse sequence (3D-TSE/FSE protocol) require a long echo time (TE). For example, magnetic resonance cholangiopancreatography (MRCP) investigations in the abdomen make use of a TE that is often greater than 500 ms and refocusing RF-pulse flip angles that are relatively high (ideally, close to 180° for this application), and at the same time a high loading of the magnetic resonance system and/or a high reflection factor may exist. "High loading" of the magnetic resonance system means that the RF transmitter, which is used to generate the radiated RF pulses, has a high transmitter reference voltage. Under such circumstances, it is often the case that the RF amplifier in the RF transmission system cannot manage to emit a complete RF pulse train, as needed. This problem is sometimes called a "burst error" and is often an inherent factor of the magnetic resonance installation itself. Although the discussion herein relates primarily to the aforementioned 3D-TSE/FSE pulse sequence, the same problem exists with other types of magnetic resonance imaging pulse sequences, such as single-shot two-dimensional turbo or fast spin-echo, or multi-slice two-dimensional turbo or fast spin-echo.

In order to achieve a long TE in the 3D-TSE/FSE pulse sequence, a long RF pulse train is required, in which many refocusing pulses are radiated within a short time. A specific example based on a realistic protocol is, with an echo spacing (ESP) of 4 ms and TE=700 ms, that at least 700/4=175 pulses are needed. Further, some additional echoes after the central echo may be acquired (as may be needed, for example, for a partial Fourier reconstruction). In this example, 183 RF pulses may then be required.

The radiation of so many RF pulses with a high flip angle within a short time unloads (discharges) the capacitors in the RF amplifier. In addition, if the loading is high (as is the case for the aforementioned abdominal examinations), the capacitor's charging and recharging rate is not sufficient so as to allow the necessary echo train to be achieved.

In order to address this problem, a "workaround" is known in which an automatic reduction of the flip angle of the refocusing pulses, down to as low as 100°, is implemented. The flip angle reduction, however, decreases the quality of the images that are reconstructed from the magnetic resonance data obtained in such a manner. Additionally, in many cases the reduction down to 100° is not sufficient, but this flip angle reduction cannot be significantly exceeded while maintaining clinically useful image quality, and represents a basic limit in the operation of the magnetic resonance apparatus. As a consequence, due to the "burst error," in some instances the 3D-TSE/FSE protocol cannot be employed. In situations where this precludes an MRCP protocol from being used, an appropriate clinical diagnosis may be precluded.

SUMMARY OF THE INVENTION

An object of the present invention is to provide a method for acquiring magnetic resonance data according to the 3D-TSE/FSE pulse sequence, wherein the aforementioned disadvantages are avoided, or at least alleviated. A further object of the invention is to provide a magnetic resonance apparatus that operates according to such a method, as well as a non-transitory, computer-readable data storage medium encoded with programming instructions that cause a magnetic resonance apparatus to be operated according to such a method.

In accordance with the invention, the problem of overloading the RF amplifier is addressed by lengthening the first echo spacing in the range of the "dummy" echoes. (The "dummy," or discarded, echoes are not included in the magnetic resonance data used to reconstruct the images.) Several of the refocusing RF pulses in the initial portion of the conventional echo train are replaced by a single refocusing RF pulse. This single refocusing RF pulse thus generates a spin echo of the excitation pulse at a later time. The generated spin echo is used for the RF pulse train in the 3D-TSE/FSE pulse sequence for the data acquisition.

The reduction of the required RF power allows the use of protocols with a long TE, for example MRCP, without exceeding the hardware limits of the RF amplifier.

In a further embodiment of the invention, diffusion effects or movement artifacts can be avoided by the long duration of dummy echoes being replaced by several refocusing RF pulses, instead of a single one. As long as the lengthened echo spacing is longer than that used during the data acquisition portion of the echo train, fewer pulses from the RF amplifier are needed.

A similar approach can be used for T2 preparation, in order to improve image quality, particularly tissue contrast.

In summary, the inventive method and apparatus are based on a significant increase (lengthening) of the first echo spacing, or the first several echo spacings, in order to reduce the number of refocusing RF pulses during the dummy echo period, and thus to reduce the demands on the RF power amplifier. One or more refocusing RF pulses can replace the refocusing RF pulses that otherwise occur during the dummy echo period.

DESCRIPTION OF THE PREFERRED EMBODIMENTS

Figure 1:
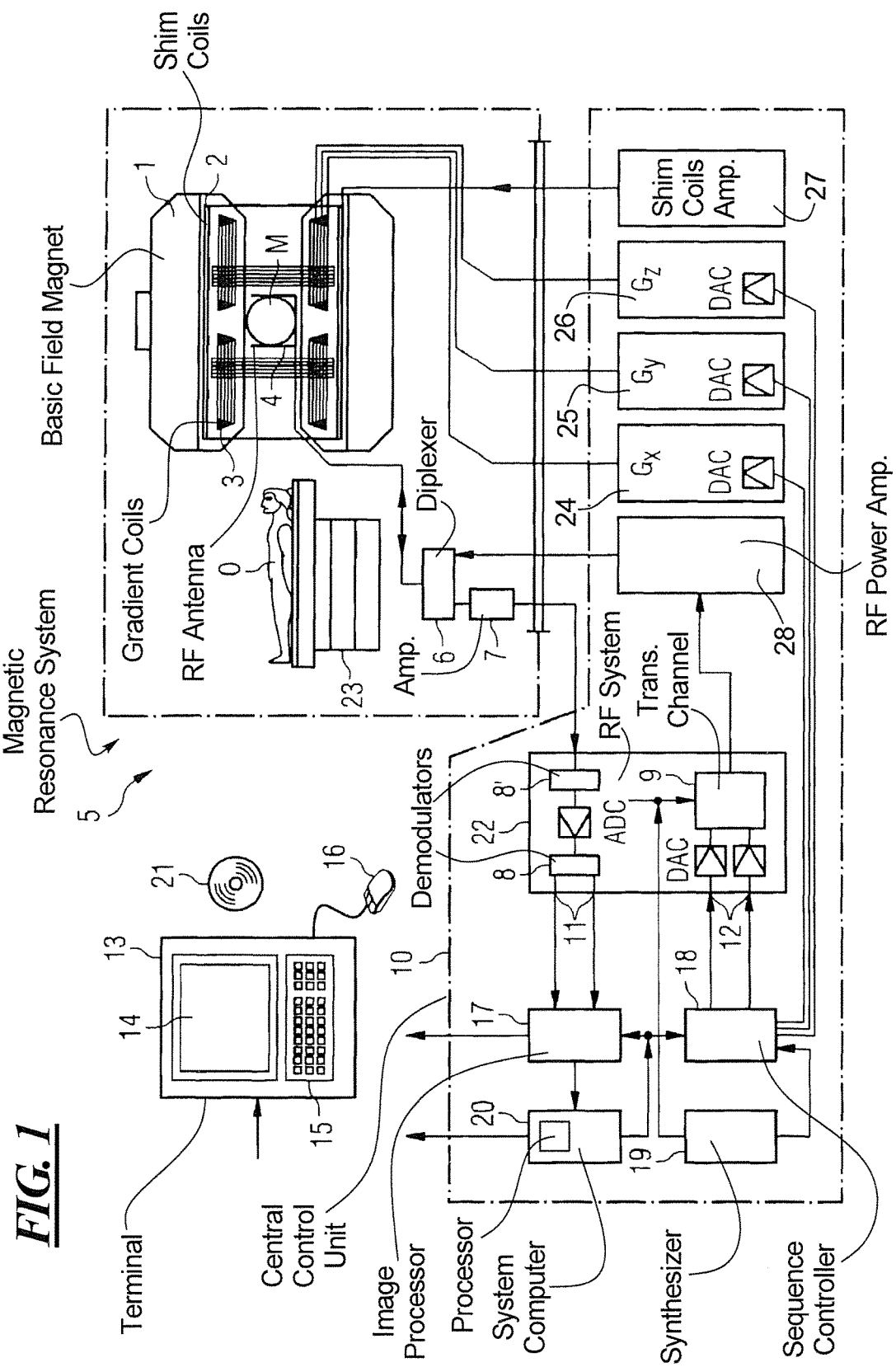
FIG. 1 is a block diagram that schematically illustrates an exemplary magnetic resonance system constructed and operating in accordance with the present invention.

FIG. 1 shows a schematic representation of a magnetic resonance system 5 (a magnetic resonance imaging or magnetic resonance tomography apparatus). A basic field magnet 1 generates a temporally constant, strong magnetic field for polarization or alignment of the nuclear spins in a selected region O of an examination subject U, for example of a part of a human body that is to be examined. The subject U lies on a table 23 and is examined in the magnetic resonance system 5. The high homogeneity of the basic magnetic field that is required for the magnetic resonance measurement is defined in a typically (but not necessarily) spherical measurement volume M into which the parts of the human body that are to be examined are introduced. Shim plates made of ferromagnetic material are attached at suitable points to assist the homogeneity requirements, and in particular to eliminate temporally invariable influences. Temporally variable influences are eliminated by shim coils 2, operated by shim coils amplifier 26.

A cylindrical gradient coil system 3 composed of three sub-windings is used in the basic field magnet 1. Each sub-winding is supplied with current by an amplifier to generate, for example, a linear (also temporally variable) gradient field in the respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. Each amplifier has a digital/analog converter that is activated by a sequence controller 18 for accurately-timed generation of gradient pulses.

Located within the gradient field system 3 are one (or more) radio-frequency antennas 4—in particular at least one multichannel RF transmission coil and at least one RF reception coil—that convert the radio-frequency pulses emitted by a radio-frequency power amplifier 27 into an alternating magnetic field for excitation of the nuclei and alignment of the nuclear spins of the examination subject U to be examined, or of the region of the selected region O of the examination subject U that is to be examined. Each radio-frequency antenna 4 is composed of one or more RF transmission coils and multiple RF reception coils in the form of an annular—preferably linear or matrix-like—arrangement of component coils. The alternating field emanating from the precessing nuclear spins—i.e. normally the spin echo signals caused by a pulse sequence composed of one or more radio-frequency pulses and one or more gradient pulses—is also converted by the RF reception coils of the respective radio-frequency antenna 4 into a voltage (measurement signal). This signal is supplied via an amplifier 7 to a radio-frequency reception channel 8 of a radio-frequency system 22. The radio-frequency system 22 furthermore has a transmission channel 9 in which the radio-frequency pulses are generated for the excitation of the magnetic resonance. The respective radio-frequency pulses are digitally represented in the sequence controller 18 as a series of complex numbers based on a pulse sequence predetermined by the system computer 20 that has a processor 24 to determine flip angles adapted from a predetermined signal curve. This number sequence is supplied as a real part and an imaginary part to a digital/analog converter in the radio-frequency system 22 via respective inputs 12, and from the digital/analog converter to the transmission channel 9. In the transmission channel 9, the pulse sequences are modulated on a radio-frequency carrier signal whose base frequency corresponds to the center frequency.

The switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M, and resulting echo signals are scanned via the RF reception coil(s). The 5 correspondingly acquired nuclear magnetic resonance signals are phase-sensitively demodulated to an intermediate frequency in a reception channel 8' (first demodulator) of the radio-frequency system 22 and digitized in an analog/digital converter (ADC). This signal is further demodulated to a frequency of 0. The demodulation to a frequency of 0 and the separation into real part and imaginary part occur in a second demodulator 8 after the digitization in the digital domain. A planar or three-dimensional MR image data set can be reconstructed by an image processor 17 from the measurement data acquired in such a manner. In the image processor 17 magnetic resonance data that may not have been acquired can be supplemented by means of known methods (such as half Fourier or partial Fourier methods) and/or magnetic resonance data that are acquired multiple times can be 5 processed into a data set. The administration of the measured magnetic resonance data, the image data and the control programs takes place via the system computer 20. Based on a specification with control programs, the sequence controller 18 monitors the generation of the respective desired pulse sequences and the corresponding scanning of k-space. In particular, the sequence controller 18 controls the accurately-timed switching of the gradients, the emission of the radio-frequency pulses with defined phase amplitude and the reception of the nuclear magnetic resonance signals.

The time base for the radio-frequency system 22 and the sequence controller 18 is provided by a synthesizer 19. The selection of appropriate control programs to generate an acquisition of magnetic resonance data (which programs are stored on a DVD 21, for example), the selection of a selected region O that should be excited and from which magnetic resonance data should be received, the specification of a substance with which the selected region O is filled to determine the flip angles for the desired signal curve, and the presentation of a generated MR image take place via a terminal 13. The terminal 13 may have a keyboard 15, a mouse 16 and a monitor 14, with which an operator can make appropriate entries in order to select a pulse sequence, in the form of an operating protocol, such as the 3D-TSE/FSE pulse sequence in accordance with the present invention.

Figure 2:
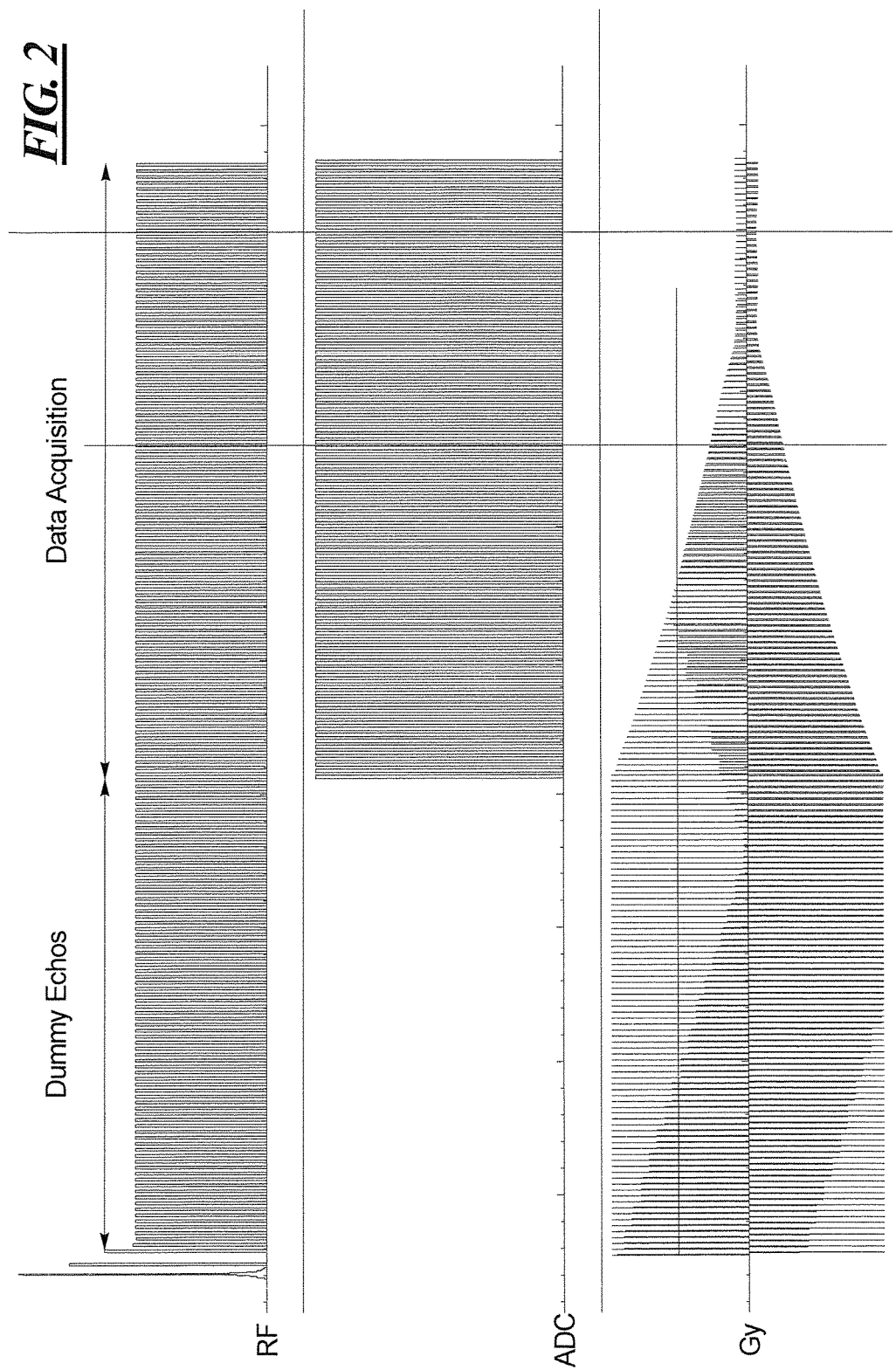
FIG. 2 schematically illustrates a conventional 3D-TSE/FSE pulse sequence wherein dummy echoes are radiated between the RF excitation and the beginning of data acquisition.

FIG. 2 shows a conventional 3D-TSE/FSE pulse sequence wherein a large number of dummy echoes occur prior to data acquisition. These are indicated on the line RF for radio-frequency excitation/refocusing. The time periods during which signals are acquired are designated on the line ADC, which represents the activation of the analog-to-digital converter. An exemplary phase-encoding gradient field Gy is also illustrated in FIG. 2.

Figure 3:
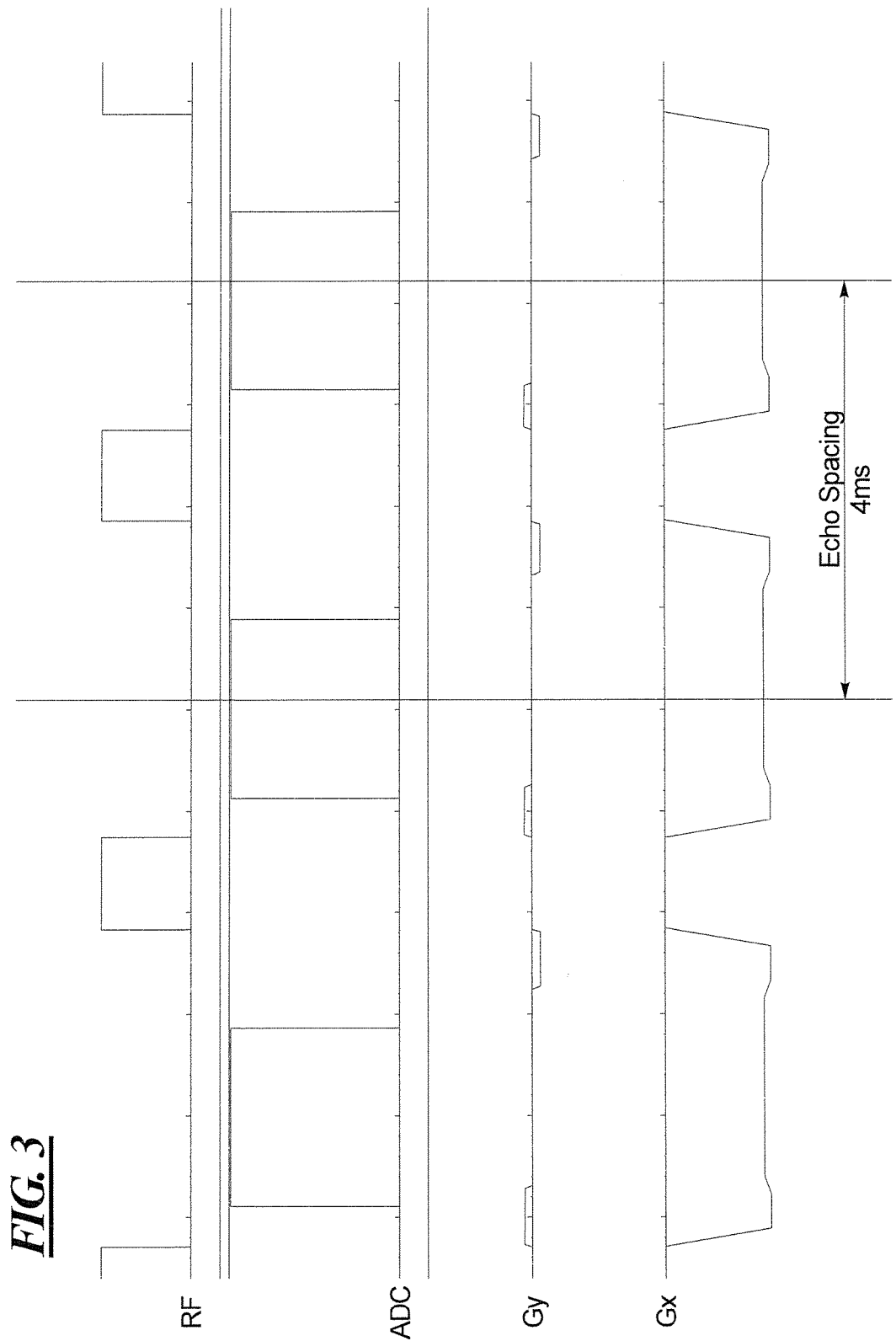
FIG. 3 schematically illustrates a typical value for the echo spacing that exists in the standard 3D-TSE/FSE pulse sequence.

FIG. 3 schematically illustrates an example of conventional echo spacing, of a duration of 4 ms, which takes place in a conventional 3D-TSE/FSE pulse sequence. In FIG. 3, an exemplary readout gradient Gx is also shown.

Figure 4:
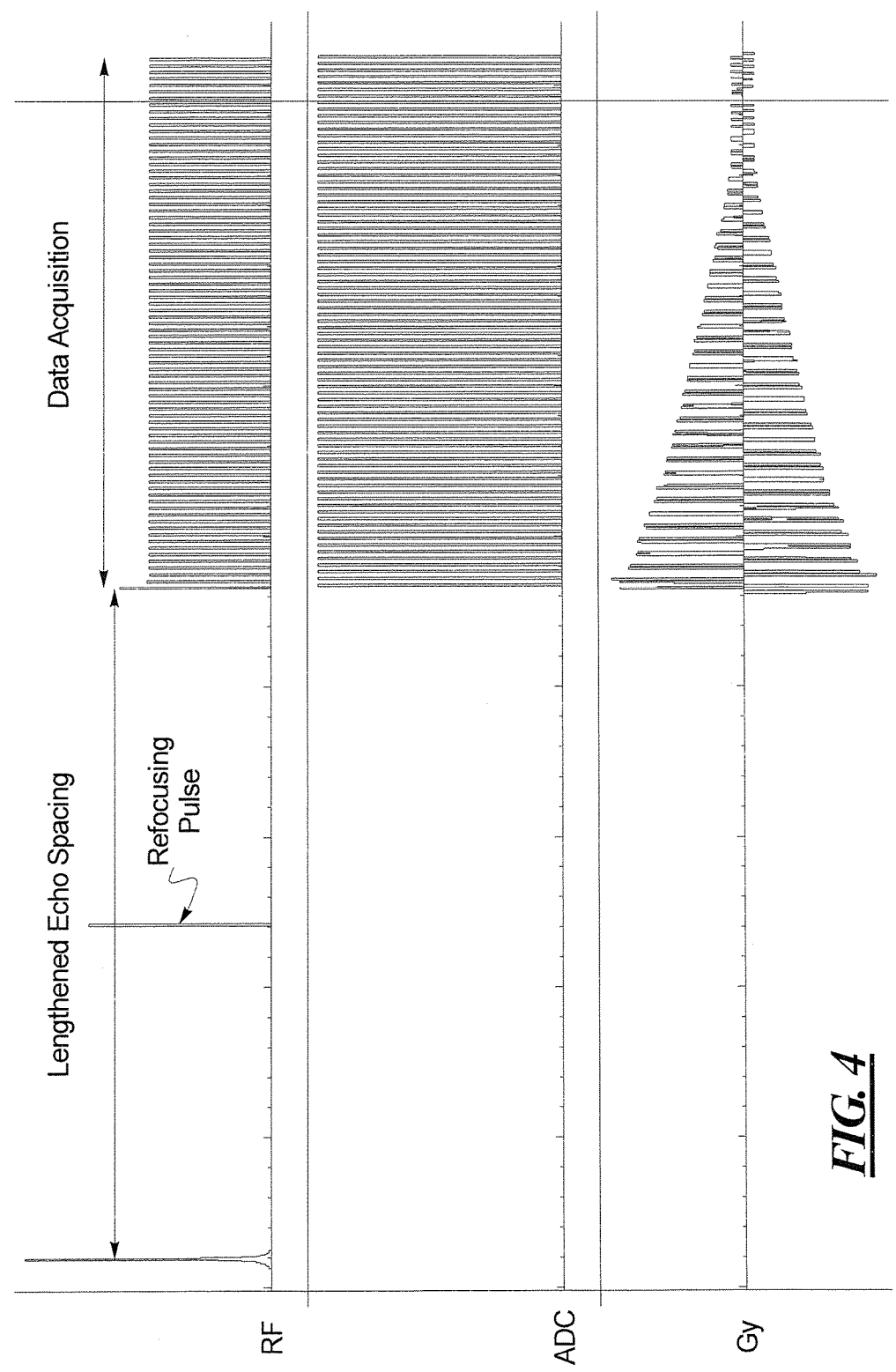
FIG. 4 schematically illustrates a first embodiment of the present invention wherein the echo spacing is lengthened.

FIG. 4 schematically illustrates the invention, wherein the echo spacing between the excitation RF pulse and the beginning of data acquisition is significantly lengthened, compared to the standard echo spacing in a conventional 3D-TSE/FSE pulse sequence.

Figure 5:
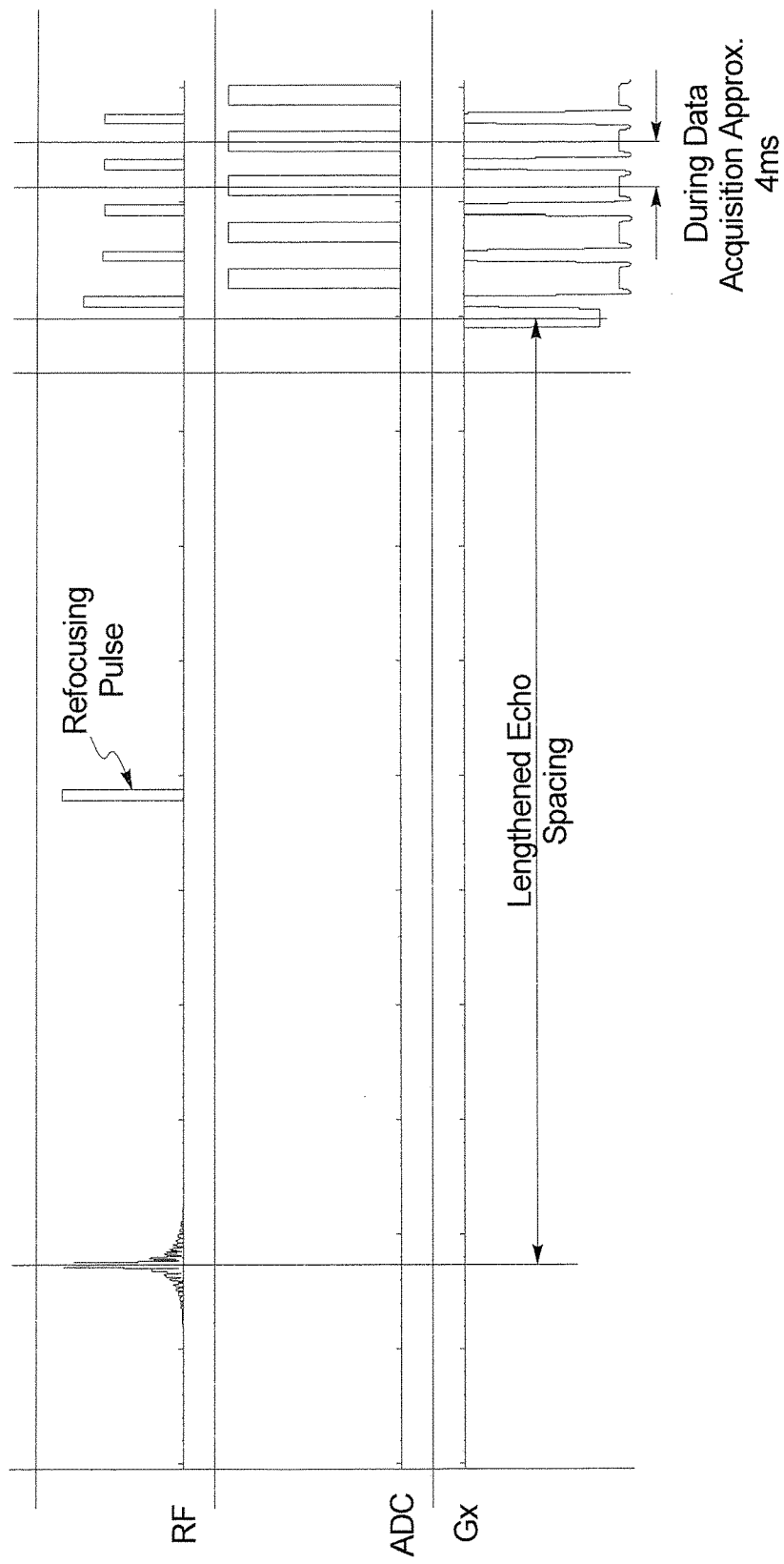
FIG. 5 schematically illustrates a further embodiment of the invention, wherein one refocusing pulse is radiated during the lengthened echo spacing.
Figure 6:
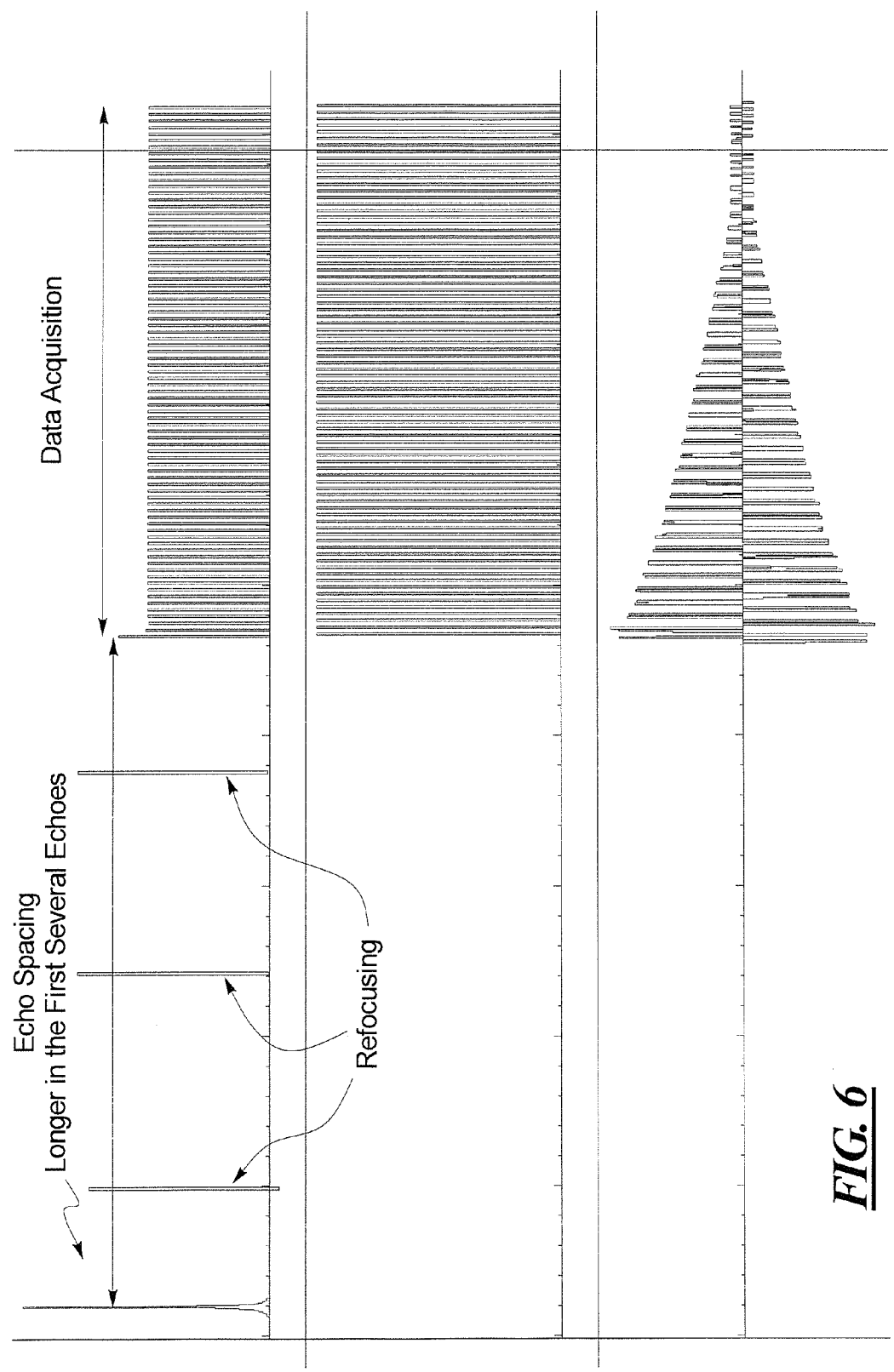
FIG. 6 schematically illustrates a further embodiment of the invention, wherein multiple refocusing pulses are radiated during the lengthened echo spacings.

In the embodiment of FIG. 4, one refocusing RF pulse is radiated during this lengthened echo spacing. FIG. 5 schematically illustrates a further embodiment wherein one refocusing RF pulse is generated during the lengthened echo spacing. FIG. 6 schematically illustrates another embodiment wherein multiple refocusing RF pulses are generated during the lengthened echo spacing.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method of acquiring magnetic resonance (MR) data from a subject, comprising:
    with a computer, accessing or generating a modified form of a standard 3D turbo or fast spin echo (3D-TSE/FSE) imaging protocol, with said standard 3D-TSE/FSE imaging protocol comprising at least one echo spacing following a radiation of an excitation radio-frequency (RF) pulse, wherein a length of said at least one echo spacing in said standard 3D-TSE/FSE imaging protocol is determined by the radiation of a number of refocusing RF pulses, via an RF channel that comprises an RF amplifier, and a subsequent readout of an echo produced by nuclear spins excited by the radiated excitation RF pulse which have also been refocused by each refocusing RF pulse in said standard 3D-TSE/FSE imaging protocol;
    from said computer, operating said MR data acquisition unit with a reduced loading of said RF amplifier, where the reduced loading of the RF amplifier is produced by modifying said at least one echo spacing of the standard 3D-TSE/FSE imaging protocol in order to lengthen the length of the at least one echo spacing to more than 500 ms, while also radiating a modified number of refocusing RF pulses that is less than the number of said refocusing RF pulses that occur in said standard 3D-TSE/FSE imaging protocol, and said MR data acquisition unit thereby acquiring raw MR data that is or has been read out from said echo; and
    in said computer, executing an image reconstruction algorithm in order to convert said acquired raw MR data into MR image data representing an image of the subject, and making the MR image data that represents the image of the subject available in electronic form at an output of said computer.

2. A method as claimed in claim 1 comprising using, as said standard 3D-TSE/FSE imaging protocol, a Sampling Perfection with Application optimized Contrasts using different flip angle Evolutions (SPACE) pulse sequence.

3. A method as claimed in claim 1 comprising operating said MR data acquisition unit according to said modified form of said standard 3D-TSE/FSE imaging protocol in order to radiate only one RF refocusing pulse via said RF transmission channel.

4. A method as claimed in claim 1 comprising operating said MR data acquisition unit according to said modified form of said standard 3D-TSE/FSE imaging protocol in order to radiate said modified number of RF refocusing pulses via said RF transmission channel.

5. A magnetic resonance (MR) apparatus comprising:
    an MR data acquisition unit comprising a radio-frequency (RF) channel comprising an RF amplifier;
    a computer configured to access or generate a modified form of a standard 3D turbo or fast spin echo (3D-TSE/FSE) imaging protocol, with said standard 3D-TSE/FSE imaging protocol comprising at least one echo spacing following a radiation of an excitation radio-frequency (RF) pulse, wherein a length of said at least one echo spacing in said standard 3D-TSE/FSE imaging protocol is determined by the radiation of a number of refocusing RF pulses, via an RF channel that comprises an RF amplifier, and a subsequent readout of an echo produced by nuclear spins excited by the radiated excitation RF pulse which have also been refocused by each refocusing RF pulse in said standard 3D-TSE/FSE imaging protocol;
    said computer being configured to operate said MR data acquisition unit with a reduced loading of said RF amplifier, where the reduced loading of the RF amplifier is produced by modifying said at least one echo spacing of the standard 3D-TSE/FSE imaging protocol in order to lengthen the length of the at least one echo spacing to more than 500 ms, while also radiating a modified number of refocusing RF pulses that is less than the number of said refocusing RF pulses that occur in said standard 3D-TSE/FSE imaging protocol, and said MR data acquisition unit thereby acquiring raw MR data that is or has been read out from said echo; and
    in said computer executing an image reconstruction algorithm in order to convert said acquired raw MR data into MR image data representing an image of the subject, and making the MR image data that represents the image of the subject available in electronic form at an output of said computer.

6. An MR apparatus as claimed in claim 5 wherein said computer is configured to use, as said standard 3D-TSE/FSE imaging protocol, a Sampling Perfection with Application optimized Contrasts using different flip angle Evolutions (SPACE) pulse sequence.

7. An MR apparatus as claimed in claim 5 wherein said computer is configured to operate said MR data acquisition unit according to said modified form of said standard 3D-TSE/FSE imaging protocol in order to radiate only one RF refocusing pulse via said RF transmission channel.

8. An MR apparatus as claimed in claim 5 wherein said computer is configured to operate said MR data acquisition unit according to said modified form of said standard 3D-TSE/FSE imaging protocol in order to radiate said modified number of RF refocusing pulses via said RF transmission channel.

9. A non-transitory, computer-readable data storage medium encoded with programming instructions, said storage medium being loaded into a computer of a magnetic resonance (MR) apparatus, which comprises a radio-frequency (RF) transmission channel comprising an RF amplifier, said programming instructions causing said computer to:

access or generate a modified form of a standard 3D turbo or fast spin echo (3D-TSE/FSE) imaging protocol, with said standard 3D-TSE/FSE imaging protocol comprising at least one echo spacing following a radiation of an excitation radio-frequency (RF) pulse, wherein a length of said at least one echo spacing in said standard 3D-TSE/FSE imaging protocol is determined by the radiation of a number of refocusing RF pulses, via an RF channel that comprises an RF amplifier, and a subsequent readout of an echo produced by nuclear spins excited by the radiated excitation RF pulse which have also been refocused by each refocusing RF pulse in said standard 3D-TSE/FSE imaging protocol;

operate said MR data acquisition unit with a reduced loading of said RF amplifier, where the reduced loading of the RF amplifier is produced by modifying said at least one echo spacing of the standard 3D-TSE/FSE imaging protocol in order to lengthen the length of the at least one echo spacing to more than 500 ms, while also radiating a modified number of refocusing RF pulses that is less than the number of said refocusing RF pulses that occur in said standard 3D-TSE/FSE imaging protocol, and said MR data acquisition unit thereby acquiring raw MR data that is or has been read out from said echo; and in said computer, executing an image reconstruction algorithm in order to convert said acquired raw MR data into MR image data representing an image of the subject, and making the MR image data that represents the image of the subject, available in electronic form at an output of said computer.

10. A storage medium as claimed in claim 9 wherein said programming instructions cause said computer to use, as said standard 3D-TSE/FSE imaging protocol, a Sampling Perfection with Application optimized Contrasts using different flip angle Evolutions (SPACE) pulse sequence.

11. A storage medium as claimed in claim 9 wherein said programming instructions cause said computer to operate said MR data acquisition unit according to said modified form of said standard 3D-TSE/FSE imaging protocol in order to radiate only one RF refocusing pulse via said RF transmission channel.

12. A storage medium as claimed in claim 9 wherein said programming instructions cause said computer to operate said MR data acquisition unit according to said modified form of said standard 3D-TSE/FSE imaging protocol in order to radiate said modified number of RF refocusing pulses via said RF transmission channel.

\* \* \* \* \*